(12) United States Patent
Sum et al.

(10) Patent No.: US 7,076,861 B2
(45) Date of Patent: Jul. 18, 2006

(54) MULTI-PACKAGE CONVERSION KIT FOR A PICK AND PLACE HANDLER

(75) Inventors: Kai Wah Sum, Singapore (SG); Wee Boon Tan, Singapore (SG); Liop Jin Yap, Singapore (SG)

(73) Assignee: St Assembly Test Services Pte., Singapore (SG)

( * ) Notice: Subject to any disclaimer, the term of this patent is extended or adjusted under 35 U.S.C. 154(b) by 139 days.

(21) Appl. No.: 10/745,149

(22) Filed: Dec. 22, 2003

(65) Prior Publication Data
US 2004/0134054 A1    Jul. 15, 2004

Related U.S. Application Data

(62) Division of application No. 10/054,423, filed on Jan. 22, 2002, now Pat. No. 6,718,608.

(51) Int. Cl.
*B23P 19/00* (2006.01)
(52) U.S. Cl. .......................................... 29/743; 29/729
(58) Field of Classification Search ............... 29/743, 29/401.1, 729, DIG. 44, 825, 832; 324/755, 324/765
See application file for complete search history.

(56) References Cited

U.S. PATENT DOCUMENTS

| 4,799,854 A * | 1/1989 | Niskala ....................... 414/737 |
| 5,117,555 A * | 6/1992 | Hunt et al. ..................... 29/840 |
| 5,920,192 A | 7/1999 | Kiyokawa |
| 6,339,321 B1 | 1/2002 | Yamashita et al. |
| 6,445,203 B1 | 9/2002 | Yamashita et al. |
| 6,505,665 B1 * | 1/2003 | Ulmer et al. ................ 156/556 |
| 6,636,060 B1 | 10/2003 | Saito |
| 2001/0054891 A1 | 12/2001 | Sagawa |
| 2002/0070144 A1 | 6/2002 | Shim |

\* cited by examiner

*Primary Examiner*—John C. Hong

(57) ABSTRACT

The present invention provides a kit and method for package-to-package conversion of a pick and place handler. An input arm assembly is provided with interchangeable vacuum leads such that package-to-package conversion only requires replacing the vacuum lead with a different size vacuum lead. An input/output shuttle plate is provided comprising a block and base plate. The block has a plurality of pocket groupings and a two or more alignment hole groupings. The base plate has two or more alignment pins. Package-to-package conversion is achieved by changing which alignment hole in each alignment hole grouping is set on the alignment pins, thereby selecting the pocket in each pocket grouping corresponding to the alignment hole used. A soak plate is provided having an array of pocket groupings, wherein each pocket grouping has the same pattern of different size/shape pockets to accommodate different packages. Package-to-package conversion is accomplished by programming an offset to the desired pocket in each pocket grouping. An test arm assembly is provided with interchangeable vacuum leads and interchangeable nest pieces such that package-to-package conversion only requires replacing the vacuum lead and nest piece with a different size vacuum lead and nest piece.

15 Claims, 7 Drawing Sheets

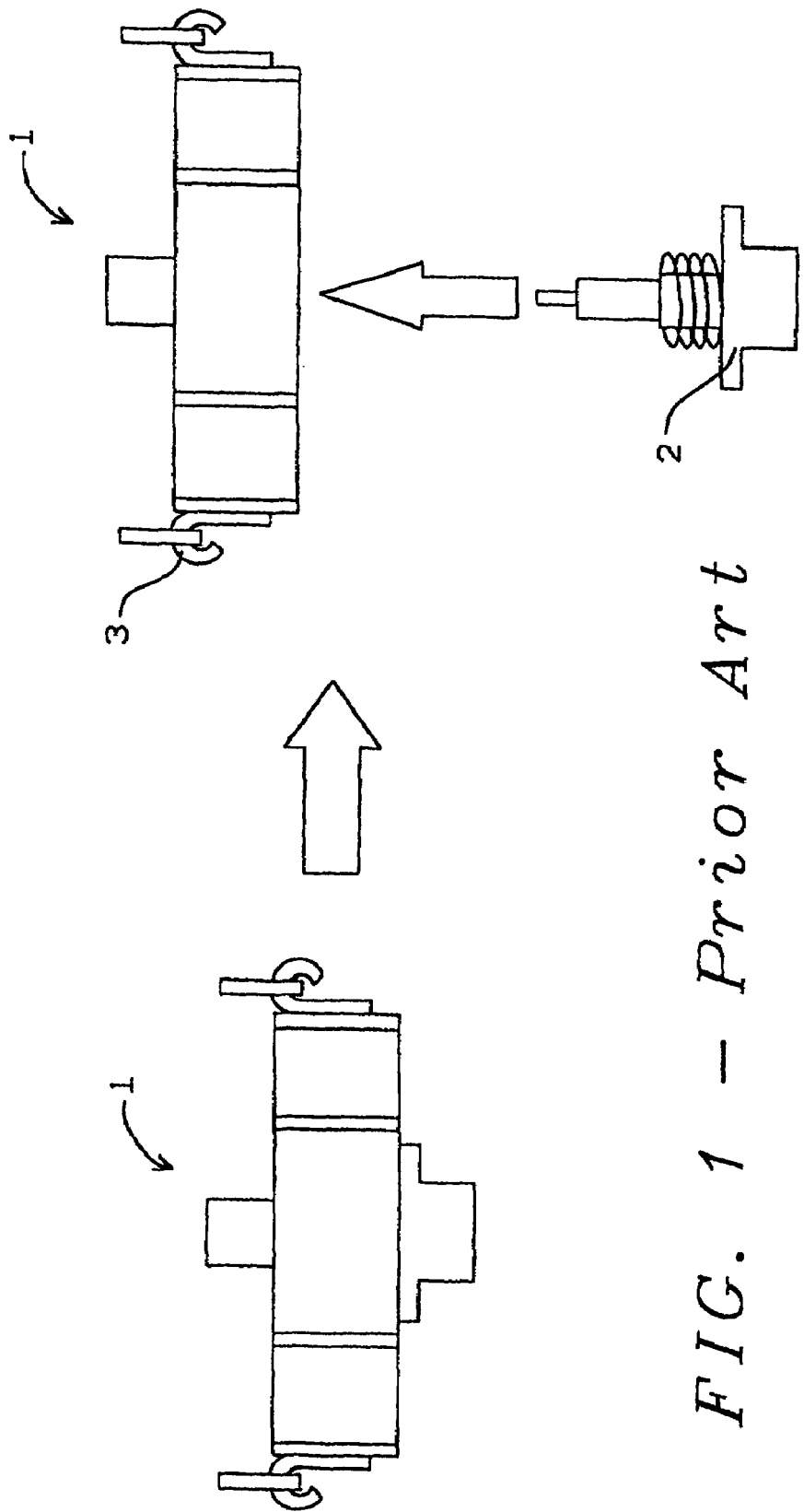
FIG. 1 – Prior Art

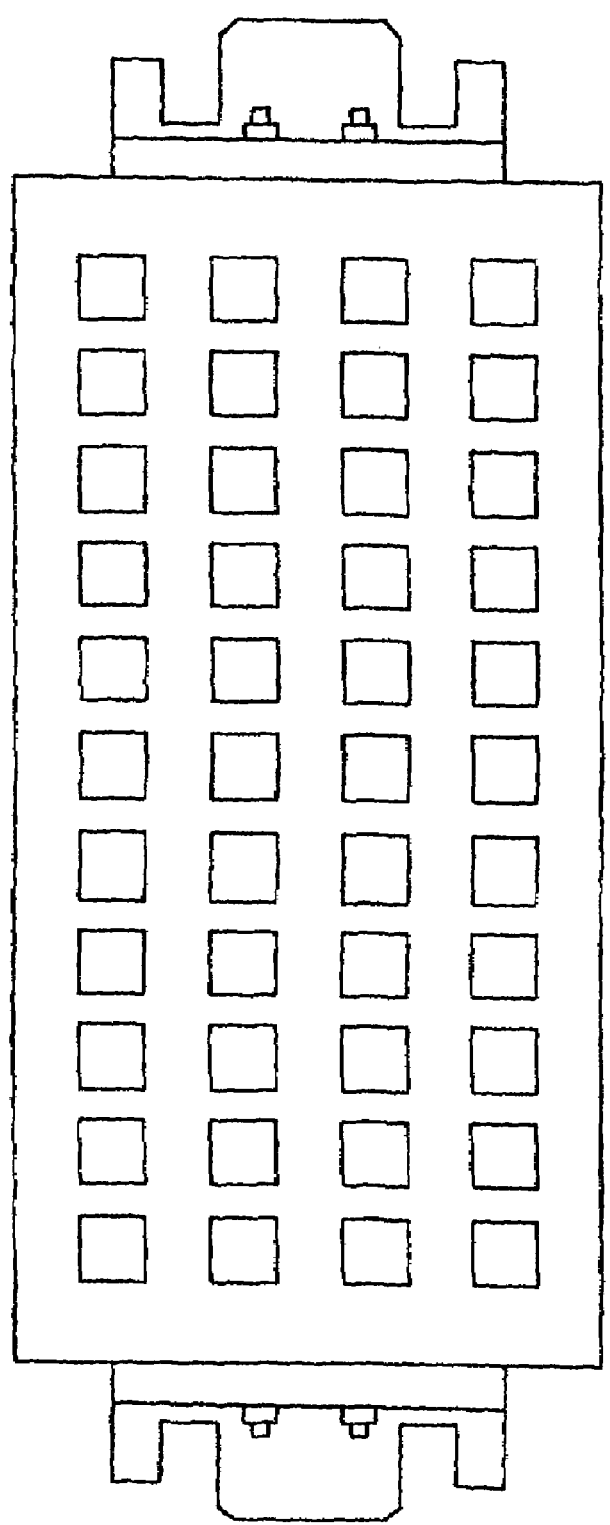
FIG. 2 – Prior Art

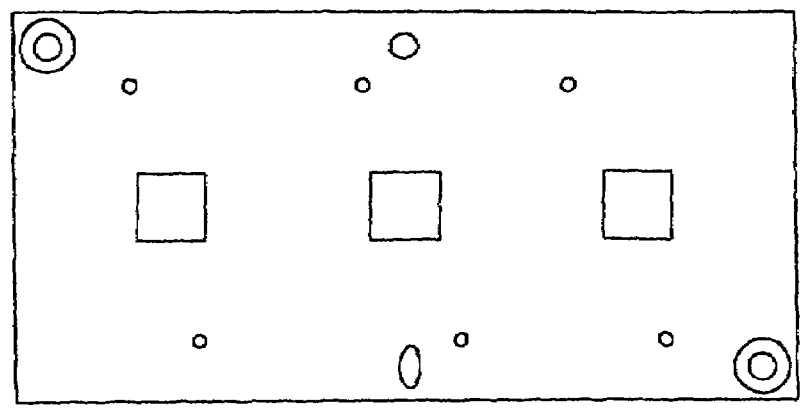
FIG. 3 – Prior Art
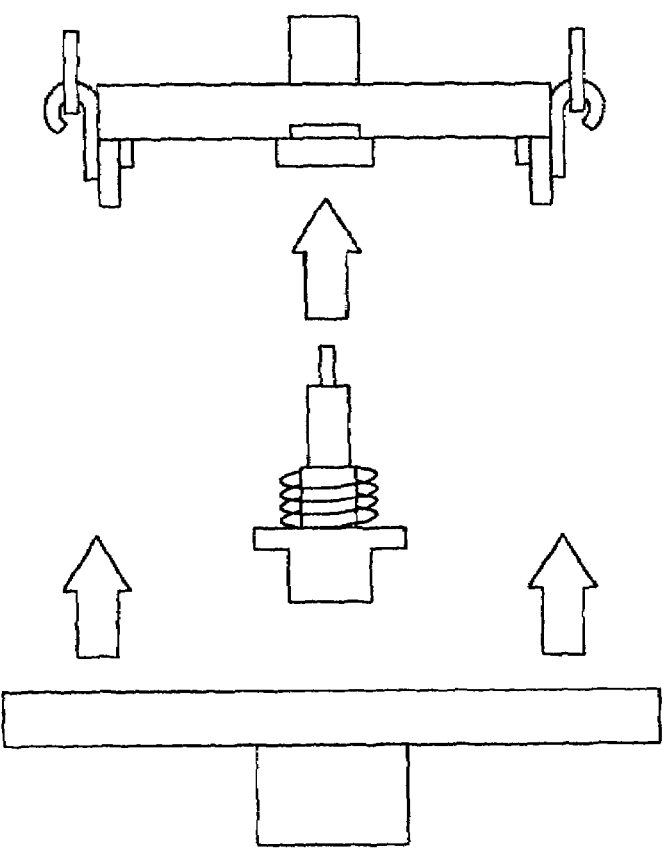
FIG. 4 – Prior Art

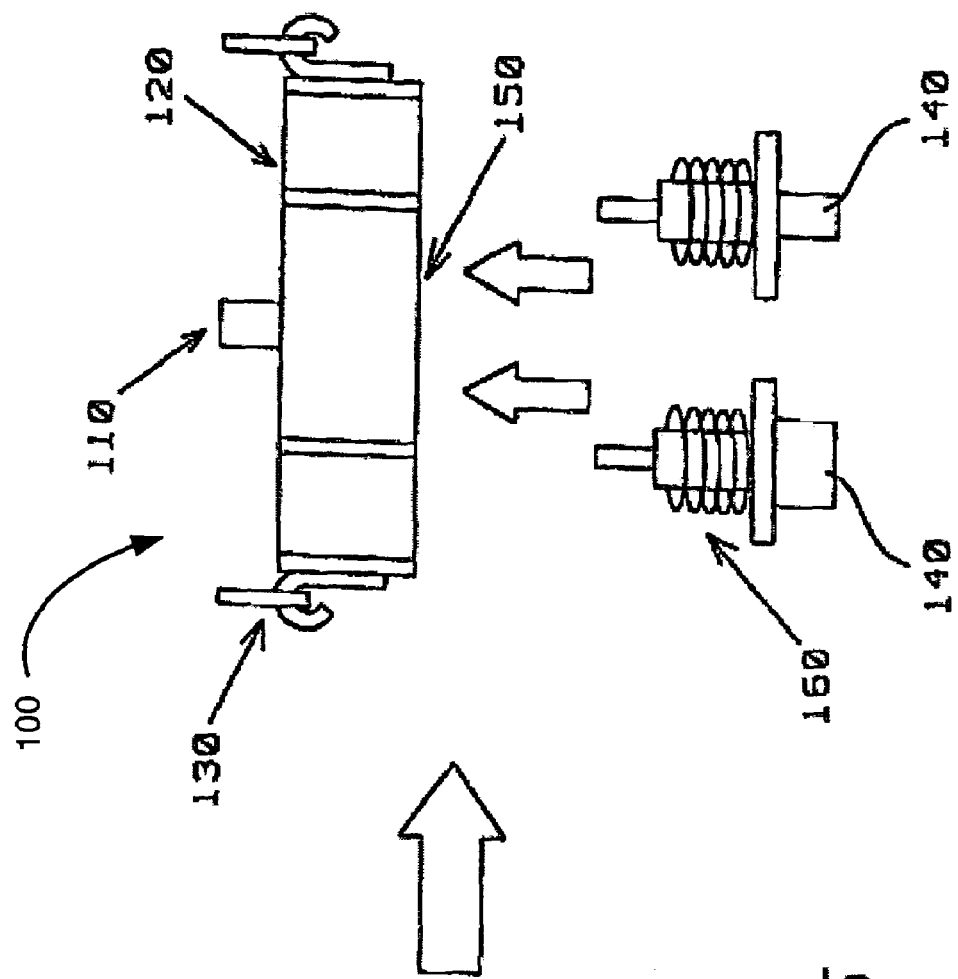
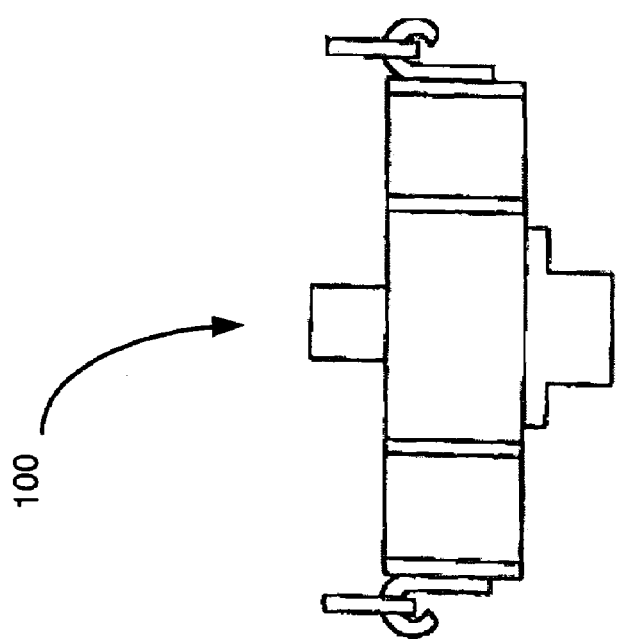
FIG. 5

MULTI-PACKAGE CONVERSION KIT FOR A PICK AND PLACE HANDLER

This is a Divisional of application Ser. No. 10/054,423 filed Jan. 22, 2002 now U.S. Pat. No. 6,718,608.

BACKGROUND OF INVENTION

1) Field of the Invention

This invention relates generally to surface mount assembly of semiconductor devices and more particularly to a method and device for converting a pick and place handler for use with devices having different packages and/or different sizes.

2) Description of the Prior Art

Pick and place handlers are widely used in surface mount technology for physically moving semiconductor devices during assembly and test. A vacuum lead is typically used to pick up a semiconductor device and hold it during transport to a new location (e.g. a circuit board or a holding fixture). However, different packages and even different sizes of a common package can require different vacuum leads.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents. U.S. Pat. No. 5,184,068 (Twigg et al.) describes a pick and place handler. U.S. Pat. No. 5,966,940 (Gower et al.) shows a thermal conditioning unit that can be incorporated into a pick and place handler.

SUMMARY OF THE INVENTION

It is an object of the present invention to provide a method and device for converting a pick and place handler to accommodate various semiconductor packages and/or sizes.

It is another object of the present invention to provide an economical method and device for converting a pick and place handler to accommodate various semiconductor packages and/or sizes.

It is yet another object of the present invention to provide a method for converting a pick and place handler to accommodate various semiconductor packages and/or sizes with reduced conversion and set-up time.

To accomplish the above objectives, the present invention provides a method and conversion kit which can be used to convert a pick and place handler for a different semiconductor package economically, and with minimum conversion and set-up time. An input arm assembly is provided with interchangeable vacuum leads such that package-to-package conversion only requires replacing the vacuum lead with a different size vacuum lead. An input/output shuttle plate is provided comprising a block and base plate. The block has a plurality of pocket groupings and a two or more alignment hole groupings. The base plate has two or more alignment pins. Package-to-package conversion is achieved by changing which alignment hole in each alignment hole grouping is set on the alignment pins, thereby selecting the pocket in each pocket grouping corresponding to the alignment hole used. A soak plate is provided having an array of pocket groupings, wherein each pocket grouping has the same pattern of different size/shape pockets to accommodate different packages. Package-to-package conversion is accomplished by programming an offset to the desired pocket in each pocket grouping. A test arm assembly is provided with interchangeable vacuum leads and interchangeable nest pieces such that package-to-package conversion only requires replacing the vacuum lead and nest piece with a different size vacuum lead and nest piece.

The present invention provides considerable improvement over the prior art. Setup time is reduced because the input arm assembly and test arm assembly can be converted by changing the interchangeable vacuum lead and the interchangeable nest piece as required, instead of changing the entire input arm assembly and the entire test arm. Set-up time is also reduced by the soak plate and input/output shuttle plate which can accommodate different packages, eliminating the need to replace them. Tool inventory and maintenance cost is reduced because separate input arm assemblies, test arm assemblies, soak plates, and input/output shuttle plates do not need to be provided and maintained for each package that the pick and place handler is to be used with.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 illustrates an input arm according to the prior art;

FIG. 2 illustrates a soak buffer according to the prior art;

FIG. 3 illustrates an input/output holding fixture according to the prior art;

FIG. 4 illustrates a test arm according to the prior art;

FIG. 5 illustrates an input arm assembly according to the invention;

DETAILED DESCRIPTION OF THE INVENTION

Figure 6:
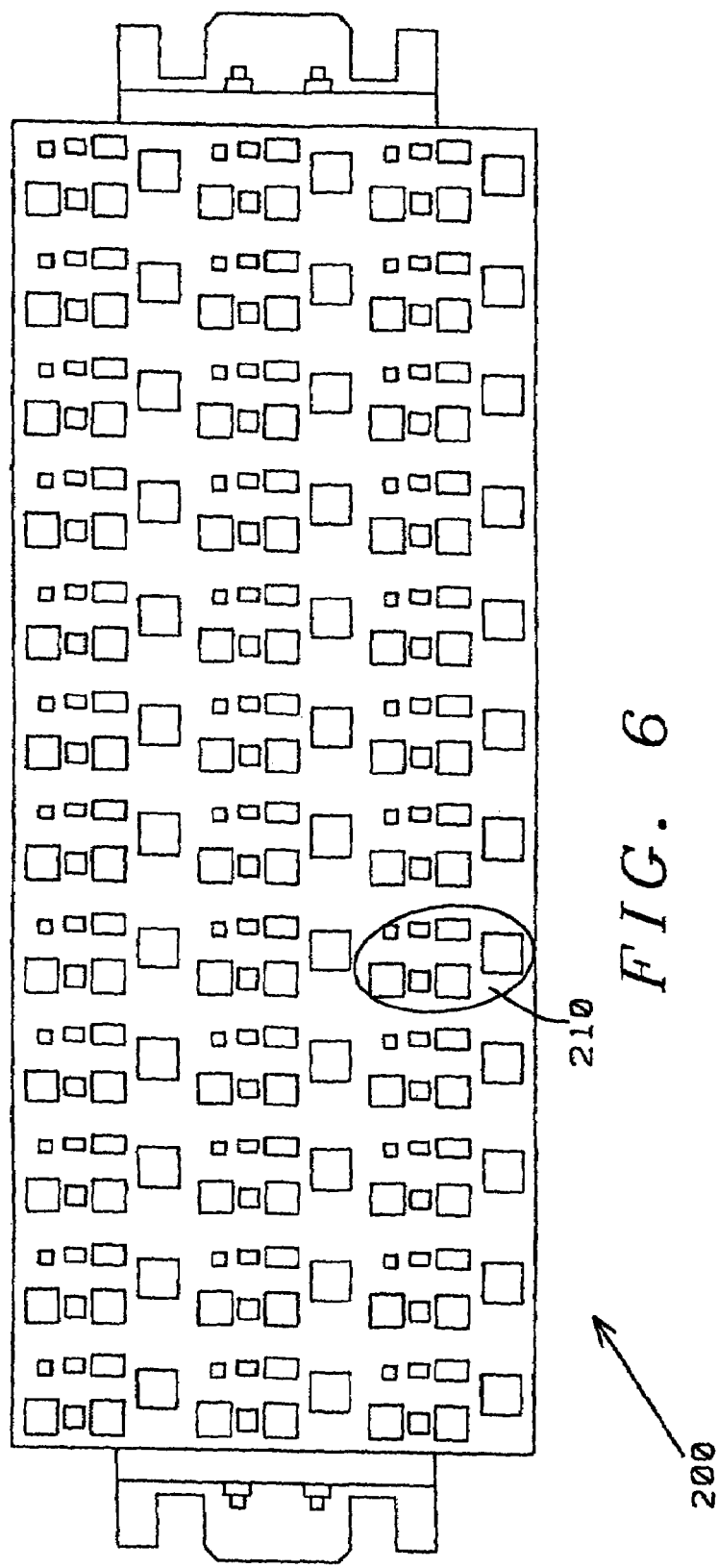
FIG. 6 illustrates a soak buffer according to the invention.

The present invention will be described in detail with reference to the accompanying drawings. The present invention provides a method and device for converting a pick and place handler for a semiconductor device with a different package and/or size.

Problem Identified by the Inventors—FIGS. 1–4

An input arm (1) known by the inventors to have a problem is shown in FIG. 1. The input arm comprises a vacuum lead (2) which is placed proximate a semiconductor device to be transported. The vacuum pressure from the vacuum lead lifts the device (picks), and transports the device to the desired location, whereupon the vacuum pressure is shut off and the device is released (place). The input arm is typically attached to a base handler by clips (3). Different packages, such as ball grip array (BGA), quad flat package (QFP), chip scale package (CSP), and plastic lead chip carrier (PLCC), and different package sizes can require different vacuum leads to adequately lift and hold the package. Conversion to a different vacuum lead requires changing the input arm. Maintaining a different input arm for each package/size is expensive, and the conversion time can increase overall manufacturing cycle time.

Another problem with converting a pick and place handler to a different package/size semiconductor device is that holding fixtures (e.g. soak buffers and I/O shuttle plates, shown in FIGS. 2 and 3 respectively) must be changed to accommodate the new package/size. Again, maintaining different fixtures for each package/size is expensive. Also, the conversion process adversely effects manufacturing cycle time.

Yet another problem with converting a pick and place handler to a different package/size semiconductor device is that a new test arm assembly, as shown in FIG. 4, is required. The test arm assembly typically comprises a contact area, which contacts the electrical leads of a device to be tested. Maintaining test arms for each package/size is expensive. The conversion process adversely effects manufacturing cycle time.

The problem with the prior art conversion kits for pick and place handlers is that they require an expensive collection of assembly arm, fixtures and test arms. Also, set-up times for converting the replacement input arm, fixtures, and test arm adversely effect manufacturing cycle time.

Preferred Embodiment of the Invention—FIGS. 5–9

Referring to FIG. 5, the preferred embodiment of the present invention begins by providing an input arm assembly (100). The input arm assembly comprises a pressure fitting (110), an input arm body (120), input arm clips (130), and a vacuum lead (140) selected from a set of interchangeable vacuum leads having different sizes. The correct size vacuum lead (140) for the semiconductor device to be picked and placed, is inserted in a through hole (150) in the input arm body (120). The vacuum lead (140) is retained by a set screw on the pressure fitting (110).

Each vacuum lead (140) has an upper hollow cylindrical portion and a lower hollow cylindrical portion with a flange therebetween. The upper cylindrical portion is inserted into the through hole (150) in the input arm body (120). The lower cylindrical portion is moved proximate to a semiconductor device, such that vacuum pressure drawn through the vacuum lead lifts and holds the semiconductor device. A compression spring (160) is placed over the upper cylindrical portion of the vacuum lead (140) to provide suspension to the input arm assembly. When the vacuum lead contacts a semiconductor device, the spring is compressed and the force on the semiconductor device is reduced.

A key advantage of the present invention is that the input arm can be converted to a different size vacuum lead by changing to a different vacuum lead from the set of interchangeable vacuum leads. This reduces set-up time compared to the prior art which requires changing the entire input arm. Inventory cost is reduced because the present invention only requires multiple vacuum leads rather than multiple input arms. Also, the present invention provides suspension, due to the spring, preventing damage to semiconductor devices when the vacuum lead contacts those semiconductor devices. Referring to FIG. 6, the soak buffer (200) of the present invention has an array of pockets groupings (210), wherein each grouping comprises the same pattern of pockets of different shapes and/or sizes to accommodate different semiconductor devices or packages. During package-to-package conversion, the base handler of a pick and place handler can be programmed to place packages into the corresponding pockets by programming an offset equal to the distance from the previous pocket in the pocket grouping to the desired pocket in the pocket grouping. Since only one soak buffer is required, the present invention eliminates the set-up time required to change soak buffers for different semiconductor packages and eliminates the cost associated with maintaining multiple soak buffers.

Figure 7:
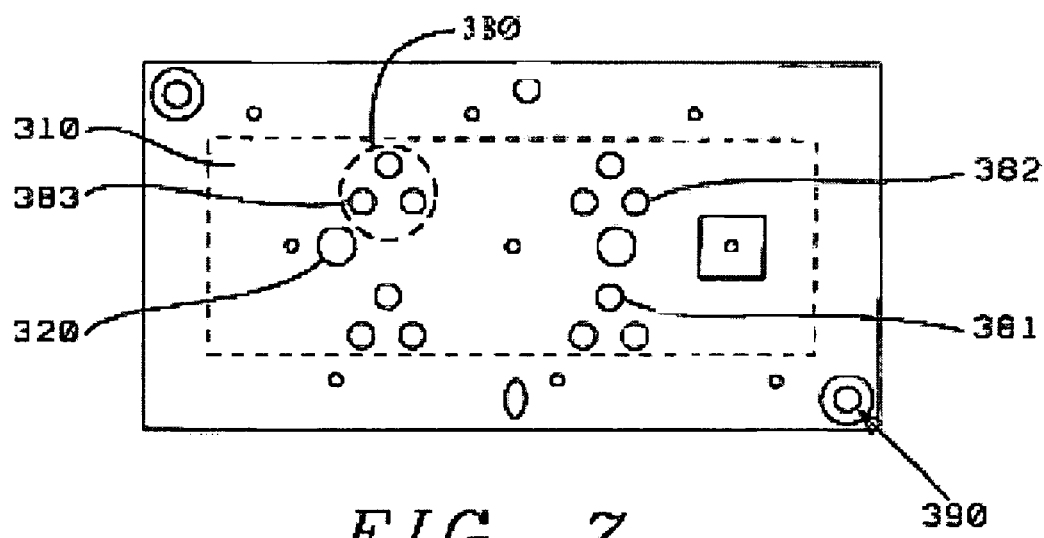
FIG. 7 illustrates an input/output shuttle plate according to the invention.

Referring to FIG. 7, the input/output (I/O) shuttle plate of the present invention comprises a base plate (310) that can be fastened onto the base handler of a pick and place handler. For example, the base plate can be fastened using a fastening means (360 in FIG. 8). The base plate comprises 2 or more alignment pins (320), most preferably 2. The base plate further comprises a series of attachment means groupings (380), such as threaded holes for attaching a block (330 in FIG. 8) to the base plate (310).

Figure 8:
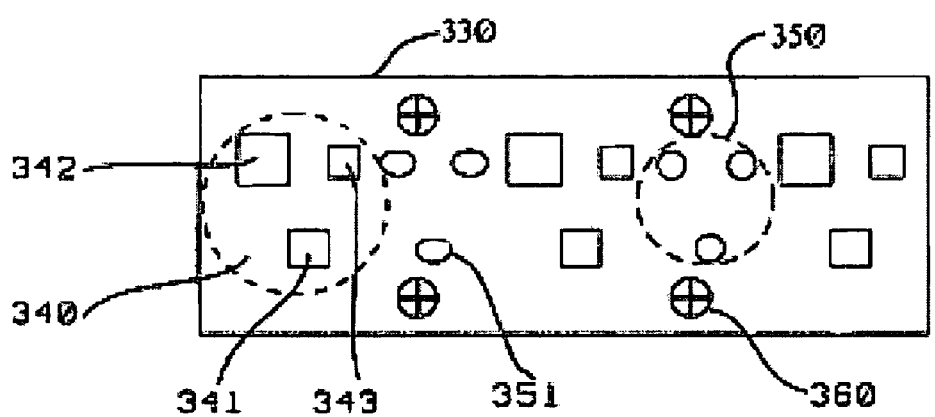
FIG. 8 illustrates a block for holding semiconductor devices prior to and after handling by an input arm of a pick and place handler, that mounts on the shuttle plate shown in FIG. 7, according to the invention.

Referring to FIG. 8, the block (330) comprises a series of pocket groupings (340). Each pocket grouping comprises pockets of different shapes and/or sizes to accommodate different semiconductor devices or packages. For example, the pocket grouping could comprise a first pocket (341), a second pocket (342) and a third pocket (343), as shown in FIG. 8. However, it should be understood that each pocket grouping could comprise a greater or lesser number of pockets. The second pocket in each grouping of pockets is offset from the first pocket by a first offset having a first distance and direction. The third pocket of each grouping of pockets is offset from the first pocket by a second offset having a second distance and direction.

The block (330) further comprises a series of alignment hole groupings (350), where the number of groupings is equal to the number of alignment pins (320 in FIG. 7) in the base plate (310 in FIG. 7), and the number of holes in each alignment hole grouping is equal to the number of pockets in each pocket grouping (340). The offsets of the alignment holes within each alignment hole grouping (350) are equal to the offsets of the pockets within each pocket grouping (340). For example, the offset of a second alignment hole (352) to a first alignment hole (351) would have a first difference and a first direction equal to the first distance and first direction of the first offset of a second pocket (342) to a first pocket (341). Similarly the offset of a third alignment hole (353) to a first alignment hole (351) would be equal to the offset of a third pocket (343) to a first pocket (341).

The block (330) is fastened to the base plate (310 in FIG. 7) by fastening means (360) in the block (330), such as unthreaded holes, through which screws pass and are threaded into one of the threaded holes in each alignment means grouping (380 in FIG. 7) in the base plate. The threaded holes (381, 382, 383) in the alignment means groupings (380) in FIG. 7 are offset by distances equal to the offsets of the pockets (341, 342, 343 in FIG. 8) but in the opposite directions, such that when the first alignment holes (351 in FIG. 8) are inserted over the alignment pins (320), the fastening means (360) in the block are lined up to the first threaded holes (381) in the base plate.

During a package-to-package conversion, the position of the block (330) relative to the base plate (310) is changed to bring the desired pockets (e.g. first pockets, second, pockets, etc) to the programmed location for picking and/or placing the semiconductor devices. The position of the block is changed by removing the fastening means, inserting the alignments holes from the alignment hole groupings corresponding to the desired pockets onto the alignment pins, and attaching the fastening means to the corresponding alignment means (threaded holes) from the alignment means groupings. The present invention reduces set-up time because package-to-package conversion can be achieved by repositioning the block instead of retrieving and installing a replacement shuttle plate. Also, costs are reduced since one shuttle plate according to the present invention can be used for multiple packages, instead of a different shuttle plate for each package.

Figure 9:
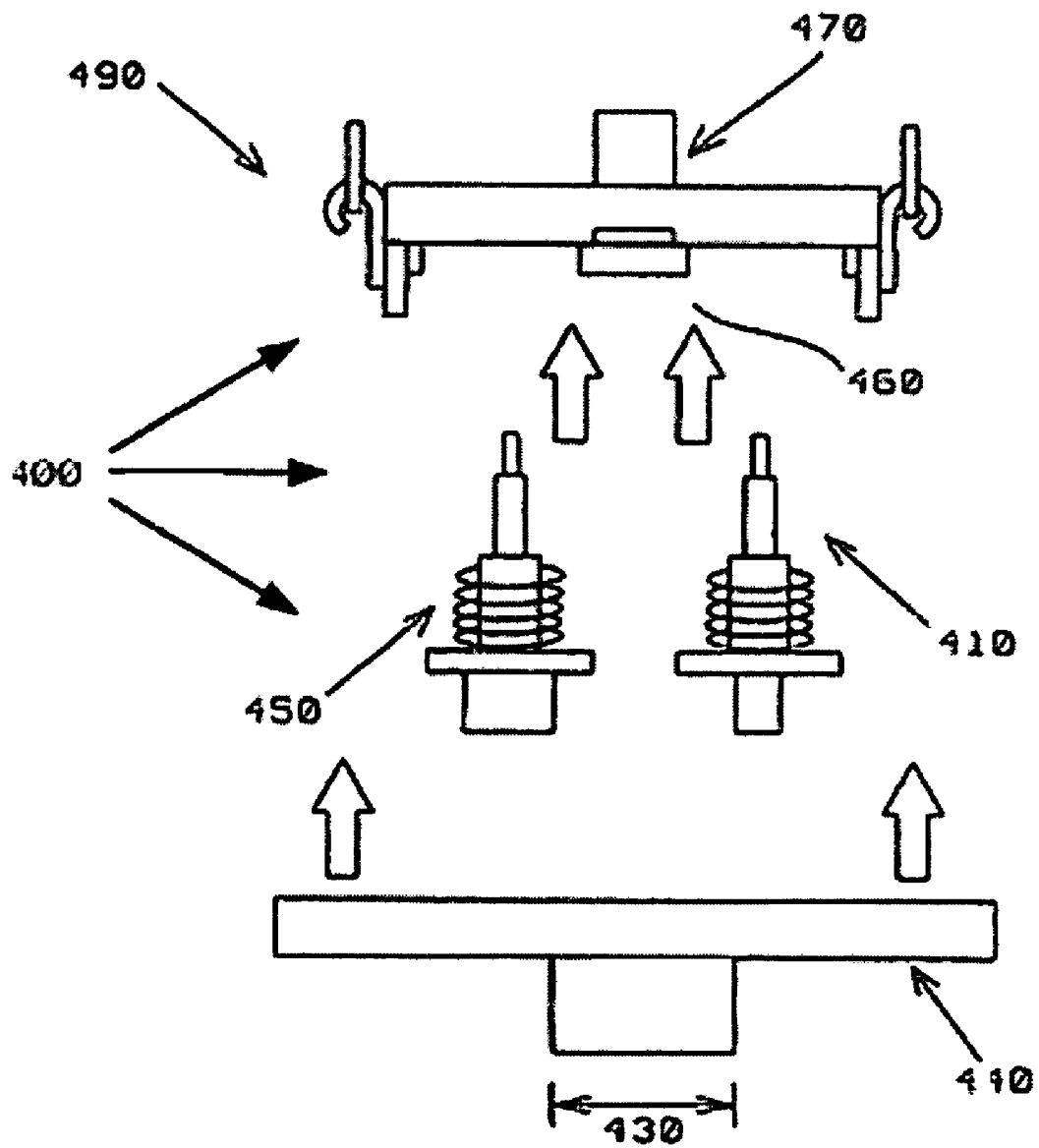
FIG. 9 illustrates a test arm assembly according to the invention.

Referring to FIG. 9, the test arm assembly (400) of the present invention has a set of interchangeable vacuum leads and a set of interchangeable nest pieces. A vacuum lead (410) selected from the set of interchangeable vacuum leads is inserted into a through hole (460) in a test arm body (480), and retained by a test arm cap (470). The test arm cap retains the vacuum lead by a set screw on the test arm cap. The test arm body is attached to pick and place handler by test arm clips (490). A test arm nest piece (440) selected from the set of test arm nest pieces is attached to the vacuum lead by vacuum pressure. The test arm nest piece (440) has a contact area (430) which is brought into contact with a semiconductor device in order to perform testing on that semiconductor device. In one embodiment of the present invention, springs (450) are provided around the vacuum lead (410) which provide suspension to prevent damage to a semiconductor device when the contact area is brought into contact with the semiconductor device. The test arm of the present invention can be converted to a different package by changing to a different vacuum lead and a different nest piece. This reduces set-up time compared to the prior art which requires removing one test arm, and retrieving and installing a different test arm. Inventory cost is reduced because the present invention only requires multiple vacuum leads and nest pieces rather than multiple test arms. Also, the present invention provides suspension, due to the spring, preventing damage to semiconductor devices when the nest piece contacts those semiconductor devices.

While the invention has been particularly shown and described with reference to the preferred embodiments thereof, it will be understood by those skilled in the art that various changes in form and details may be made without departing from the spirit and scope of the invention. For example, in the I/O shuttle plate, the alignment means groupings could be located on the block and fastening means could be located in the base plate. Also, in the I/O shuttle plate, alignment holes could be in the base plate, and alignment pins could be located in the block.

What is claimed is:

1. An input/output shuttle plate, comprising:
   (a) a block having a plurality of pocket groupings therein, whereby each pocket grouping consists of a pattern of pockets of different sizes and/or shapes having specific offsets from each other; two or more alignment hole groupings wherein each alignment hole grouping consists of a pattern of holes having the same offsets from each other as the corresponding pockets within said pattern of pockets; and a plurality of attachment holes; and
   (b) a base plate comprising two or more alignment pins and a plurality of attachment means groupings wherein each attachment means grouping consists of a pattern of attachment means having offsets from each other with the same distances as the offsets between corresponding pockets in said pattern of pockets but in the opposite directions from said pockets; whereby, when a particular alignment hole in each of said alignment hole groupings is fitted onto said alignment pins, the corresponding pocket in each pocket grouping is correctly located for the pick and place handler; and said attachment holes are aligned with the attachment means in each attachment means grouping corresponding to said pockets.

2. The input/output shuttle plate of claim 1 wherein said base plate has two alignment pins and said block has two alignment hole groupings.

3. The input/output shuttle plate of claim 1 wherein said attachment means groupings consist of threaded holes, whereby said block is fastened to said base plate by screws which are placed through an attachment hole from each attachment hole grouping and threaded into a threaded hole from each attachment means grouping.

4. A test arm assembly for a pick and place handler, comprising:
   (a) a test arm body having a cap thereon, a through hole opposite said cap, and test arm clips for attaching said test arm assembly to said pick and place handler;
   (b) a set of interchangeable vacuum leads having different sizes; each vacuum lead of said set of interchangeable vacuum leads having a hollow upper cylindrical portion, a hollow lower cylindrical portion, and a flange therebetween; and
   (c) a set of interchangeable nest pieces each nest piece having a contact area where said nest piece contacts a corresponding semiconductor device for testing; wherein a nest piece corresponding to a semiconductor device to be tested is selected from said set of nest pieces, a vacuum lead with the desired size for said selected nest piece is selected from said set of interchangeable vacuum leads, said selected vacuum lead is inserted into said through hole of said test arm body and retained by said cap, and said selected nest piece is attached to said vacuum lead by vacuum pressure.

5. The test arm assembly of claim 4 wherein each vacuum lead further comprises a compression spring around said upper cylindrical portion resting on said flange; whereby, when said vacuum lead is inserted into said test arm body, said spring contacts said test arm body at its end opposite said flange, providing suspension such that when said nest piece contacts a semiconductor device, said spring is compressed and the force on said semiconductor device is reduced.

6. A kit for package-to-package conversion of a pick and place handler, comprising:
   (a) an input arm assembly for a pick and place handler, comprising a set of interchangeable vacuum leads having different sizes; each vacuum lead of said set of interchangeable vacuum leads having a hollow upper cylindrical portion, a hollow lower cylindrical portion, and a flange therebetween; wherein a vacuum lead with the desired size for a semiconductor device to be picked and placed is chosen from said set of interchangeable vacuum leads;
   (b) a soak buffer for a pick and place handler, comprising an array of pocket groupings; wherein each pocket grouping comprises the same pattern of pockets of different shapes and/or sizes to accommodate different semiconductor packages; whereby package-to package conversion can be achieved by programming an offset into said pick and place handler to cause the pick and place handler to move to a different pocket in each of said pocket groupings;

(c) an input/output shuttle plate, comprising: (i) a block having a plurality of pocket groupings therein, whereby each pocket grouping consists of a pattern of pockets of different sizes and/or shapes having specific offsets from each other; two or more alignment hole groupings wherein each alignment hole grouping consists of a pattern of holes having the same offsets from each other as the corresponding pockets within said pattern of pockets; and a plurality of attachment holes; and (ii) a base plate comprising two or more alignment pins and a plurality of attachment means groupings wherein each attachment means grouping consists of a pattern of attachment means having offsets from each other with the same distances as the offsets between corresponding pockets in said pattern of pockets but in the opposite directions from said pockets; whereby, when a particular alignment hole in each of said alignment hole groupings is fitted onto said alignment pins, the corresponding pocket in each pocket grouping is correctly located for the pick and place handler; and said attachment holes are aligned with the attachment means in each attachment means grouping corresponding to said pockets; and (d) a test arm assembly for a pick and place handler, comprising: (i) a set of interchangeable vacuum leads having different sizes; each vacuum lead of said set of interchangeable vacuum leads having a hollow upper cylindrical portion, a hollow lower cylindrical portion, and a flange therebetween; and (ii) a set of interchangeable nest pieces each nest piece having a contact area where said nest piece contacts a corresponding semiconductor device for testing.

7. A pick and place system for a pick and place handler for a plurality of semiconductor packages comprising:
an input/output shuttle plate comprising:
a block having a plurality of pocket groupings provided therein and a plurality of grouped first alignment means, each of the plurality of pocket groupings having a predetermined relationship with each of the plurality of grouped first alignment means, the block has a plurality of first attachment means; and
a base plate having a plurality of grouped second alignment means, each of the plurality of grouped second alignment means engageable with each of the plurality of grouped first alignment means to provide a pocket in the plurality of pocket groupings correctly located for the pick and place handler, the base plate has a plurality of second attachment means engageable with the first attachment means for securing the block to the base plate with the pocket correctly located for the pick and place handler.

8. The system as claimed in claim 7 wherein:
the block has a plurality of first attachment means, each of the plurality of first attachment means having a predetermined relationship with each of the plurality of the plurality of pocket groupings; and
the base plate has a plurality of second attachment means, each of the plurality of second attachment means engageable with one of the plurality of first attachment means for securing the block to the base plate with the pocket correctly located for the pick and place handler.

9. The system as claimed in claim 7 further comprising:
a plurality of interchangeable vacuum leads, each of the plurality of interchangeable vacuum leads having a hollow lower cylindrical portion sized for picking up one of the plurality of semiconductor packages, each of the plurality of semiconductor packages having a different shape or size.

10. The system as claimed in claim 9 wherein the plurality of interchangeable vacuum leads has a hollow upper cylindrical portion and a flange between the hollow lower cylindrical portion and the hollow upper cylindrical portion, the hollow upper cylindrical portion having the same size and shape for all of the plurality of interchangeable vacuum leads.

11. The system as claimed in claim 7 further comprising:
an input arm body having a pressure fitting, a through hole opposite the pressure fitting, and clips for attaching the input arm body to a base unit for a pick and place handler.

12. The system as claimed in claim 7 further comprising:
a soak buffer for the pick and place handler, comprising an array of pocket groupings, each pocket grouping comprises the same pattern of pockets of different shapes or sizes for the plurality of semiconductor packages, each of the plurality of semiconductor packages having a different shape or size, the different shape or size accommodated by programming an offset into the pick and place handler to cause the pick and place handler to move to a different pocket in each of the array of pocket groupings.

13. The system as claimed in claim 7 further comprising:
a test arm assembly for a pick and place handler comprising:
a test arm body having attaching means for attaching the test arm assembly to the pick and place handler;
a set of interchangeable vacuum leads connectable to the test body, each of the interchangeable vacuum leads for one of the plurality of semiconductor packages having a different shape or size; and
a set of interchangeable nest pieces each nest piece having a contact area where the nest piece contacts one of the plurality of semiconductor packages having a different shape or size for testing.

14. The system as claimed in claim 13 wherein a nest piece for one of the plurality of semiconductor packages having a different shape or size to be tested is selected from the set of nest pieces, a vacuum lead with the desired size for the selected nest piece is selected from the set of interchangeable vacuum leads, the selected vacuum lead is connected to the test arm body, and the selected nest piece is attached to the vacuum lead by vacuum pressure.

15. The system as claimed in claim 7 further comprising:
a kit comprising:
the input/output shuttle plate;
a soak buffer having a pattern of pockets for accommodating the plurality of semiconductor packages, each of the plurality of semiconductor packages having a different shape or size;
a plurality of interchangeable vacuum leads, each of the plurality of interchangeable vacuum leads connectable to an input arm of the pick and place handler and sized for picking up one of the plurality of semiconductor packages, each of the plurality of semiconductor packages having a different shape or size; and
a set of interchangeable nest pieces each nest piece having a contact area where the nest piece contacts one of the plurality of semiconductor packages having a different shape or size for testing.

* * * * *

UNITED STATES PATENT AND TRADEMARK OFFICE
CERTIFICATE OF CORRECTION

| | |
|---|---|
| PATENT NO. | : 7,076,861 B2 |
| APPLICATION NO. | : 10/745149 |
| DATED | : July 18, 2006 |
| INVENTOR(S) | : Sum et al. |

Page 1 of 1

It is certified that error appears in the above-identified patent and that said Letters Patent is hereby corrected as shown below:

First page, Abstract section (57), line 1, cancel the text beginning with "the present invention provides" to and ending "vacuum lead and nest piece." on line 23 an insert the following abstract:

A kit is provided for package-to-package conversion of a pick and place handler. An input arm assembly is provided with interchangeable vacuum leads. An input/output shuttle plate is provided comprising a block and base plate. The block has a plurality of pocket groupings and a two or more alignment hole groupings. The base plate has two or more alignment pins. Package-to-package conversion is achieved by changing alignment hole groupings on the alignment pins, thereby selecting the pocket corresponding to the alignment hole used. A soak plate is provided having an array of pocket groupings, wherein each pocket grouping has the same pattern of different size/shape pockets to accommodate different packages. Package-to-package conversion is accomplished by programming an offset to the desired pocket in each pocket grouping. A test arm assembly is provided with interchangeable vacuum leads and interchangeable nest pieces.

Signed and Sealed this

Twenty-fourth Day of October, 2006

JON W. DUDAS
*Director of the United States Patent and Trademark Office*

UNITED STATES PATENT AND TRADEMARK OFFICE
CERTIFICATE OF CORRECTION

PATENT NO.        : 7,076,861 B2                                                              Page 1 of 1
APPLICATION NO.   : 10/745149
DATED             : July 18, 2006
INVENTOR(S)       : Sum et al.

It is certified that error appears in the above-identified patent and that said Letters Patent is hereby corrected as shown below:

In the drawings, Sheet 6 of 7, FIG. 8, the reference numeral 352 should be added to the second alignment hole and reference number 353 should be added to the third alignment hole, as follows:

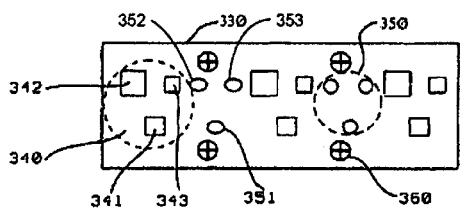

FIG. 8

In the drawings, Sheet 7 of 7, FIG. 9, the reference numeral 480 should be added to the test arm body, as follows:

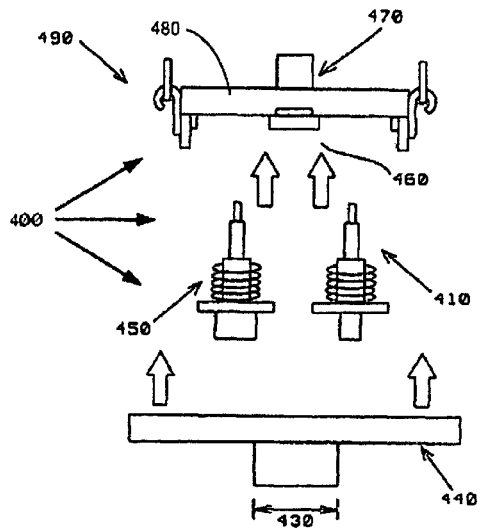

FIG. 9

Signed and Sealed this

Sixth Day of April, 2010

David J. Kappos
*Director of the United States Patent and Trademark Office*